United States Patent
Padovan et al.

(10) Patent No.: US 12,537,481 B2
(45) Date of Patent: Jan. 27, 2026

(54) CIRCUIT COMPRISING A CURRENT MIRROR CIRCUIT AND METHOD FOR OPERATING A CIRCUIT

(71) Applicant: Infineon Technologies AG, Neubiberg (DE)

(72) Inventors: Fabio Padovan, Villach (AT); Dmytro Cherniak, Villach (AT); Saleh Karman, Villach (AT); Luigi Grimaldi, Villach (AT); Giovanni Boi, Padua (IT)

(73) Assignee: Infineon Technologies AG, Neubiberg (DE)

( * ) Notice: Subject to any disclaimer, the term of this patent is extended or adjusted under 35 U.S.C. 154(b) by 3 days.

(21) Appl. No.: 18/409,300

(22) Filed: Jan. 10, 2024

(65) Prior Publication Data
US 2024/0250640 A1    Jul. 25, 2024

(30) Foreign Application Priority Data
Jan. 20, 2023 (DE) .......................... 102023200451.8

(51) Int. Cl.
H03B 5/36    (2006.01)
H03B 5/12    (2006.01)
H03B 23/00   (2006.01)
H03L 7/099   (2006.01)

(52) U.S. Cl.
CPC ........... *H03B 5/366* (2013.01); *H03B 5/1228* (2013.01); *H03B 23/00* (2013.01); *H03L 7/099* (2013.01); *H03B 2200/0038* (2013.01)

(58) Field of Classification Search
CPC .................. H03B 5/366; H03B 5/1228; H03B 2200/0038; H03B 23/00; H03L 2207/06; H03L 7/099; H03L 7/08; H04B 2001/6912
USPC ........................... 331/175, 182, 183, 167, 57
See application file for complete search history.

(56) References Cited

U.S. PATENT DOCUMENTS 6,788,161 B2 *   9/2004  Vilander .................. H03B 5/04
                                                      331/185
7,852,168 B1 *  12/2010  Song ...................... H03L 7/099
                                                      331/185

FOREIGN PATENT DOCUMENTS

DE            10251695 A1     5/2004

* cited by examiner

*Primary Examiner* — Arnold M Kinkead
(74) *Attorney, Agent, or Firm* — Harrity & Harrity, LLP

(57) ABSTRACT

The disclosure relates to a circuit including a current mirror circuit with a current path including a first transistor and a replica current path including a second transistor. The current path is connected to the replica current path to influence a current in the replica current path based on a reference current in the current path. The current in the replica current path may be proportional to the reference current. The circuit further includes a capacitor coupled between a gate of the second transistor and a first potential, a switch coupled between a gate of the first transistor and the gate of the second transistor to selectively disconnect the gate of the first transistor from the gate of the second transistor and from a first electrode of the capacitor. The disclosure further relates to a method for operating a circuit including a current mirror circuit.

18 Claims, 2 Drawing Sheets

CIRCUIT COMPRISING A CURRENT MIRROR CIRCUIT AND METHOD FOR OPERATING A CIRCUIT

CROSS-REFERENCE TO RELATED APPLICATION

This application claims priority to German Patent Application No. 102023200451.8 filed on Jan. 20, 2023, the content of which is incorporated by reference herein in its entirety.

TECHNICAL FIELD

The present disclosure relates to the field of an electronic circuit comprising a current mirror with a current path and a replica current path and to a method for operating a circuit comprising a current mirror.

BACKGROUND

A current mirror is a circuit configured to mirror or copy a reference current through a current path with a first active device, e.g., first transistor, by controlling the current in a replica current path with a second active device, e.g., second transistor, of a circuit, keeping the output current constant regardless of loading. The mirrored or copied current in the replica current path is then proportional to the reference current through the first active device and may result in an output current of the current mirror. A current mirror may reverse the current direction as well.

The current mirror may be used to provide bias currents and active loads to other circuits. The current output by the current mirror may for example be input to another circuit and influence a signal generated by the other circuit. The other circuit may for example be a high frequency circuit generating and/or transmitting a high frequency signal and the output current of the current mirror may for example be a bias current for an electronic device, which may be a device of the high frequency circuit.

With a bias current the operating point of an electronic device, e. g. the device of the high frequency circuit, can be set. The bias current may be the DC current at a terminal of the device at a time when no input signal is applied. A current mirror circuit may serve as a bias circuit supplying this bias current to the electronic device.

The noise of oscillator circuits and in general most of the circuits which need a bias current is often dominated by the noise of the reference current of the current mirror used to generate the bias current. This noise may for example result from the bandgap of the first transistor T1 and/or a voltage to current converter V2I used to generate the input current to the current mirror. This noise is multiplied by the current mirror ratio that may be above 100.

SUMMARY

A circuit includes a current mirror circuit with a current path including a first transistor and a replica current path including a second transistor. The current path is connected to the replica current path to influence a current in the replica current path based on a reference current in the current path. The current in the replica current path may also be referred to as replica current. The reference current and the replica current may for example be DC currents (DC: direct current).

The replica current is proportional to the reference current. The replica current and the reference current may have the same magnitude, or the replica current may be proportionally smaller than the reference current or the replica current may be proportionally larger than the reference current. In an implementation, the replica current is proportionally larger than the reference current.

A current that is input to the current path of the current mirror may result in a reference current which may influence the replica current. The replica current may then be an amplified version of the reference current, as the current mirror may create a replica current which is proportionally larger than the reference current. The ratio of replica current to reference current may be referred to as current mirror ratio.

A capacitor is coupled between a gate of the second transistor of the replica current path and a first potential. A first electrode of the capacitor is coupled to the gate of the second transistor and a second electrode of the capacitor is coupled to the first potential. A switch is coupled between a gate of the first transistor of the current path and the gate of the second transistor of the replica current path to selectively disconnect the gate of the first transistor from the gate of the second transistor and from the first electrode of the capacitor.

By opening the switch, the gate of the first transistor can be selectively disconnected from the gate of the second transistor. This means that the current path with the reference current can be selectively disconnected from the replica current path. During times of such disconnection, it is possible to prevent any distortions or noise present in the reference current from influencing the replica current. The selective opening of the switch can be used advantageously to limit the influence of noise in the reference current on the replica current and on any output current of the current mirror that depends on the replica current.

During such times of disconnection with an open switch, a voltage from the capacitor is provided to the gate of the second transistor to keep up the functioning of the second transistor and the replica current path. The size of the capacitor corresponds to the amount of electrical energy that the capacitor can store. When the gate of the second transistor is provided with voltage from the capacitor, electrical energy is provided to the gate from the capacitor and the capacitor may be discharged. The size of the capacitor may be chosen to fit the amount of electrical energy needed to feed the gate of the second transistor with a voltage during times, when the switch is open. As the circuit may be configured such that the discharge is of a small amount, the capacitor may be chosen to be of relatively small size thus limiting the cost of the circuit and keeping the area used by the capacitor small.

In an implementation, the switch may be controllable to connect the gate of the first transistor to the gate of the second transistor and the first electrode of the capacitor during a first phase and to disconnect the gate of the first transistor from the gate of the second transistor and from the first electrode of the capacitor during a second phase.

This allows for charging the capacitor during the first phase and to feed electrical energy from the current path into the replica current path. This implementation also allows for providing a voltage from a potential of the first electrode of the capacitor to the gate of the second transistor during the second phase. During the second phase, the replica current is not influenced by noise or distortion in the reference current, because the gate of the second transistor in the replica current path is fed by the capacitor and not by the gate of the first transistor in the current path. During the second phase, the output current of the current mirror may therefore be shielded from noise in the reference current.

The circuit may be regarded as a current mirror with a sample and hold circuit in between the two current paths. The sample and hold circuit includes the switch on the one hand and the capacitor as a means for storing energy on the other hand. The capacitor may be replaced by another means for storing electrical energy. The sample phase corresponds to the first phase when the switch is closed. The hold phase corresponds to the second phase, when the switch is open.

In an implementation the circuit may include a high frequency circuit including a high frequency transmitter. The high frequency transmitter may be controlled to transmit a high frequency signal during the second phase. In examples of this implementation, the replica current in the replica current path may be output by the current mirror circuit and applied as a bias current to an electronic device of the high frequency circuit.

In examples of the circuit, the first and second phases may occur periodically. This allows for a periodic operation, which may depend on the output signal of another circuit, to which the output current of the current mirror is fed.

The high frequency circuit may include a radar device generating and/or transmitting a radar signal. The other circuit, to which the output current of the current mirror is fed, may for example be such a radar device. The first and second phase can thus be made dependent from the radar signal that is being generated and/or transmitted by the radar device. The impact of noise on the radar signal may for example be reduced by making the first and second phase dependent from the radar signal.

In examples, the radar device includes an FMCW (Frequency Modulated Continuous Wave) radar device and the first phase is a flyback time of the generation of the high frequency signal. A FMCW radar signal includes several so-called chirps, during which the frequency of the radar signal is linearly increased. During the flyback time, also referred to as reset time, the frequency is set back to the lower frequency. In other examples, the first phase may be between frames of the high frequency signal. A frame is a periodically repeated structure of a high frequency signal. A frame of a FMCW radar signal may include several chirps. The flyback time and the time between frames of the signal are periods of time when no radar signal is transmitted by the radar device. Any noise from in the reference current which may be propagated to the replica current and from there to a bias current used by the radar device may therefore not influence the transmitted signal of the radar device. Transmission of the radar signal happens during the second phase, when the switch is open, and the replica current is not affected by noise in the reference current.

The first potential may be at one of a supply potential or a ground potential. Both solutions may be chosen for the circuit and may influence the type of transistor used within the current mirror.

In certain implementations, the circuit may further include a voltage-controlled oscillator, a digitally controlled oscillator and/or a power amplifier. In examples of this implementation, the current in the replica current path may be output by the current mirror circuit and applied as a bias current to the voltage-controlled oscillator, the digitally controlled oscillator and/or the power amplifier.

A voltage-controlled oscillator (VCO) is an electronic oscillator whose oscillation frequency is controlled by a voltage input. The applied input voltage determines the instantaneous oscillation frequency. A digitally controlled oscillator (DCO) is an oscillator circuit, whose oscillation frequency is controlled by a digital control signal. A VCO or a DCO may be used for generating a modulation signal in a high frequency circuit. A power amplifier is an electronic device which can increase the power of a signal. It may be included in a high frequency circuit.

In certain implementations, the high frequency circuit includes a high frequency generator to generate the high frequency signal and/or a high frequency transmitter to transmit the high frequency signal, wherein the switch is controlled based on the high frequency signal. The switch may be controlled based on at least one parameter of the high frequency signal, for example the frequency and/or the duty cycle of the high frequency signal. This allows for controlling the switch in a way to reduce the influence of noise in the reference current on the high frequency signal.

In some examples, the switch may be controlled depending on the duty cycle of the high frequency signal and to open during times, when the high frequency signal is transmitted.

In certain examples, the switch may be controlled by a signal including a frequency depending on the frequency of the high frequency signal. In an implementation, the frequency of the signal controlling the switch may be synchronized to the high frequency signal. The synchronization may for example be chosen such that the frequency of the high frequency signal is an integer multiple of the frequency of the signal controlling the switch. The closing of the switch may then be synchronized to the frequency of the high frequency signal such that the switch is closed when the impact on the high frequency signal is low, e. g. during times of low amplitude of the high frequency signal.

In implementations of the circuit, the circuit and/or the switch may be configured to charge the capacitor during the first phase. The circuit may be configured such that the gate of the second transistor is connected to the first electrode of the capacitor during the second phase such that the gate of the second transistor is controlled by a potential of the first electrode of the capacitor. This may correspond to a sample and hold circuit with the sample phase during the first phase and the hold phase during the second phase.

A circuit includes a current mirror circuit with a current path including a first transistor and a replica current path including a second transistor, wherein the current path is connected to the replica current path, and wherein a capacitor is coupled between a gate of the second transistor and a first potential. A first electrode of the capacitor is coupled to the gate of the second transistor and a second electrode of the capacitor is coupled to the first potential. A method for operating such a circuit includes:

Influencing a current in the replica current path based on the reference current in the current path, the current in the replica current path being proportional to the reference current, and selectively disconnecting a gate of the first transistor from the gate of the second transistor and from the first electrode of the capacitor.

In an implementation, the gate of the first transistor may be connected to the gate of the second transistor and to the first electrode of the capacitor during a first phase and the gate of the first transistor may be disconnected from the gate of the second transistor and from the first electrode of the capacitor during a second phase.

In an implementation of the method, the replica current is output to a high frequency circuit, influencing the generation and/or transmission of a high frequency signal.

In an implementation, the method includes charging the capacitor during the first phase and connecting the gate of the second transistor to the first electrode of the capacitor during the second phase such that the gate of the second transistor is controlled by a potential of the first electrode.

BRIEF DESCRIPTION OF THE FIGURES

Implementations will now be described with reference to the attached drawing figures by way of example only. Like reference numerals are used to refer to like elements throughout. The illustrated structures and devices are not necessarily drawn to scale.

DETAILED DESCRIPTION

Figure 1:
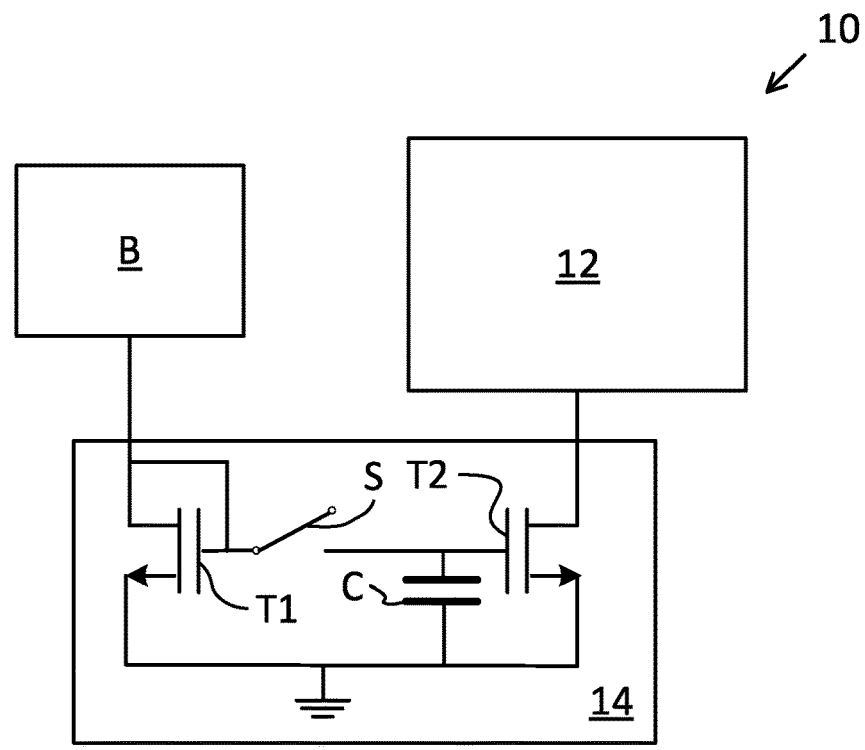
FIG. 1 illustrates a schematic block diagram of a circuit comprising a current mirror.

FIG. 1 illustrates a schematic block diagram of a circuit 10 comprising a current mirror 14. An input current is generated by an input current generator B. The input current is fed into the current mirror 14. The input current is fed into a current path of the current mirror 14 comprising a first transistor T1. The current flowing through the current path with the first transistor T1 is also called reference current. The current mirror 14 comprises a replica current path with a second transistor T2. The current flowing through the replica current path is also called replica current. The replica current is output from the current mirror 14 to another circuit 12. The transistors T1, T2 may be any kind of transistor, like bipolar transistors or MOSFET. In examples of the current mirror 14, the first and second transistor T1, T2 are of the same type. A current mirror ratio will then depend on the difference of area of the first and second transistor T1, T2.

The gate of the first transistor T1 is connectable to a gate of the second transistor T2 via a switch S. The switch S might be any suitable type of switch for this application, in particular a semiconductor-based switch like e. g., a cascaded switch, a MOS or a PMOS switch.

A first electrode of a capacitor C is coupled to the gate of the second transistor T2 and a second electrode of the capacitor C is coupled to ground. When the switch S is closed, the current mirror 14 amplifies reference current flowing through the current path to a replica current flowing through the replica current path. The replica current is proportional to the reference current flowing through the current path. In an implementation the replica current may be of the same magnitude as the reference current. In another implementation the replica current is a multiple of the reference current.

The current mirror 14 may for example have a current mirror ratio between one and 1000, for example one hundred. This means that the replica current may be one to 1000 times larger than the reference current. The current mirror ratio is basically defined by the first and second transistor T1, T2 and the areas they comprise. Different areas of transistors T1, T2 may define different current mirror ratios.

In a typical example of the current mirror 14 the replica current is a hundred times larger than the current flowing through the current path. This also means that an input current input into the current path may result in an output current of the current mirror 14 that has a magnitude which corresponds to the magnitude of the reference current multiplied by the current mirror ratio. Typical values for the reference current may be in the order of magnitude of a tenth of a µA. Typical values for the replica current may be in the order of magnitude of a tenth of a mA.

The first electrode of the capacitor C is coupled to the switch S and to the gate of the second transistor T2. The switch S may be controlled to selectively connect or disconnect the gate of the first transistor T1 from the gate of the second transistor T2 and from the first electrode of the capacitor C. The second electrode of the capacitor C is connected to ground.

The output current provided by the current mirror 14 to the other circuit 12 may in turn influence a signal generated by the other circuit 12. In an implementation, the other circuit 12 may be a high frequency circuit comprising a high frequency generator and a high frequency transmitter. The output current of the current mirror 14 may then be used by a device of the other circuit 12, e.g., as a bias current for a power amplifier or a controlled oscillator.

When the switch S is closed the replica current is directly influenced by the current flowing through the current path. Also, when there is noise in the current flowing through the current path. This noise will also be reflected in the replica current. As the replica current might be an amplified version of the reference current that noise may also be amplified together with the current. Noise in the replica current will then be present in the output current of the current mirror 14. It may not be desirable to feed such an output current with noise to the other circuit 12, as the quality of the operation of the other circuit 12 may be affected.

In some implementations, therefore, the switch S may be selectively closed during a first phase Ph1 of operation of the current mirror 14 and the switch S may be selectively opened during a second phase Ph2 of operation of the current mirror 14.

During the first phase Ph1, when the switch S is closed, the replica current is directly influenced by the current flowing through the current path and the first transistor T1. At the same time, during the first phase Ph1, the capacitor C is charged via the current flowing over the closed switch S.

During a second phase Ph2 of operation, the switch is open. There is no direct connection in between the gate of the first transistor T1 and the gate of the second transistor T2 during the second phase Ph2. The voltage applied to the gate of the second transistor T2 is provided by the capacitor C. This voltage applied to the gate of the second transistor T2 allows the replica current to flow through the replica current path of the current mirror 14. The discharge of the capacitor C during the second phase Ph2, e.g., due to leakage, may be small, if the current mirror 14 is properly configured. It is therefore possible to design the current mirror 14 in a way that the capacitor C can be of relatively small size.

The current mirror 14 as described in relation to FIG. 1 allows for the switch S to be selectively controlled. The current mirror 14 allows any noise present in the input current from the output current of the current mirror 14 to be selectively cut off when the switch S is open during the second phase Ph2. Noise present in the input current to the current mirror 14 will not be reflected in the output current of the current mirror 14 during the second phase Ph2. Only during the first phase Ph1, when the switch S is closed, noise of the input current will be reflected to the output current of the current mirror 14. By choosing the occurrence of the first phase Ph1 appropriately, the influence of noise on the output current can be minimized.

Keeping in mind that the output current of the current mirror 14 may influence a signal generated by the other circuit 12, this can advantageously be used by making the first phase Ph1 and second phase Ph2 dependent from the use of the output current in the other circuit 12. For example, if the other circuit 12 comprises a signal generating and/or signal transmission device, the occurrence of the first phase Ph1 can be selectively timed such that the influence on the signals generated by the other circuit is as low as possible.

A method for operating such a circuit 10 as shown in FIG. 1 comprises influencing the replica current based on the reference current in the current path, the replica current being proportional to the reference current, and selectively disconnecting the gate of the first transistor T1 from the gate of the second transistor T2 and from the first electrode of the capacitor C. The gate of the first transistor T1 may for example be disconnected from the gate of the second transistor T2 and from the first electrode of the capacitor C by opening the switch S.

The switch S may be controlled by a control signal to close during a first phase Ph2 and to open during a second phase Ph2. The method of operating the circuit 10 may further comprise charging the capacitor C during the first phase Ph1 and controlling the gate of the second transistor T2 by a potential of the first electrode of the capacitor C during the second phase Ph2.

The method may further comprise outputting the replica current of the circuit 10 to a high frequency circuit 12, influencing the generation and/or transmission of a high frequency signal.

The closing of the switch S may create some noise in the output current. The circuit 10 may therefore be configured to keep this switching noise to a low level. In some implementations, the frequency of the control signal for the switch S may be synchronized with the signal generated by the other circuit, as described in connection with FIG. 4. This synchronization allows to reduce the impact of such switching noise, as the switching noise will happen, when the amplitude of the signal generated by the other circuit 12 is small, because it is close to a zero crossing point.

Figure 2:
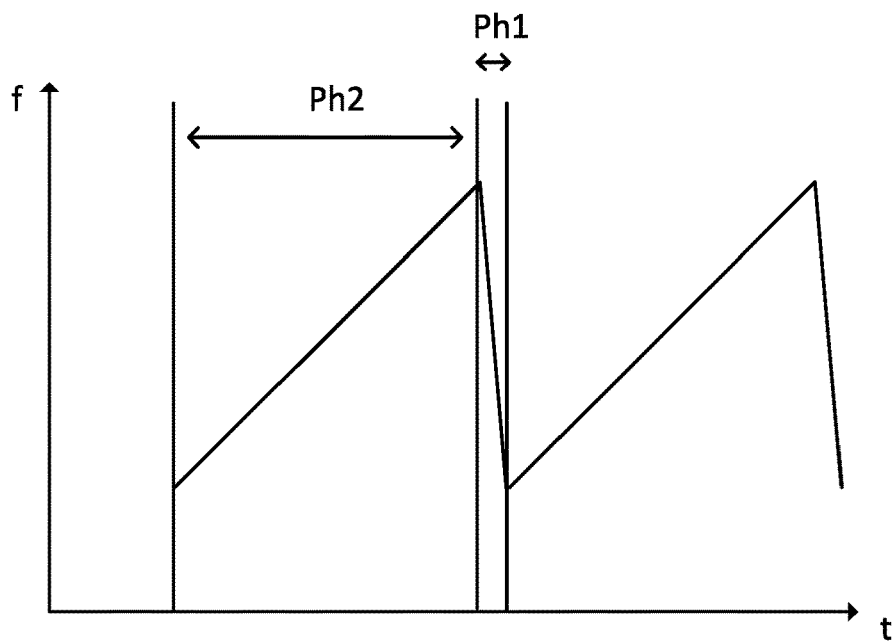
FIG. 2 schematically illustrates an example of a high frequency signal.

With reference to FIG. 2, the circuit 10 and method will be further described using the example of a radar device. The radar device may be the other circuit 12 or the other circuit 12 may be comprised in the radar device. In FIG. 2 an example of a high frequency signal is shown. The example shown in FIG. 2 is an FMCW radar signal. In FMCW radar, the frequency of the signal is frequency modulated with increasing frequency resulting in a frequency ramp. During a flyback time the frequency of the signal is again reduced to a lower frequency, which will then serve as the starting frequency of new ramp of frequency modulation. The frequency ramp may also be referred to as a chirp. In FIG. 2 two chirps of the frequency modulation are shown with a flyback time in between the two chirps. The ramp may for example have a duration in between 100-500 µs, e.g., 200 µs, and the reset time may have a duration in between 0.5-5 µs, e.g., 1 µs.

The switch S of the current mirror 14 as shown in FIG. 1 may be controlled depending on the radar signal as shown in FIG. 2.

In the case of FMCW radar the radar signal is transmitted during a chirp. During transmission of the radar signal it is desired to reduce the noise of the radar device, in particular the noise present in any bias currents provided to the radar device. If a circuit 10 like the one shown in FIG. 1 comprising the current mirror 14 provides the bias current to a device of the radar device, it is desired to have the noise of the bias current as low as possible. It is therefore advantageous to choose the second phase Ph2, e.g., the time when the switch S is open, to be while the radar signal is transmitted. For the case of FMCW radar, this is for example during a chirp as shown in FIG. 2. The first phase Ph1, e.g., when the switch S is closed can then happen during a flyback time of the radar signal, when no radar signal is actually transmitted.

The circuit 10 in the current mirror 14 may be configured in a way that the first phase Ph1 does not need to happen during each flyback time of the radar signal but only during certain flyback times of the radar signal. The second phase Ph2 may also cover times when no radar signal is transmitted, as reset times in the radar signal may happen more frequently than the closing of the switch S during the first phase Ph1.

Figure 3:
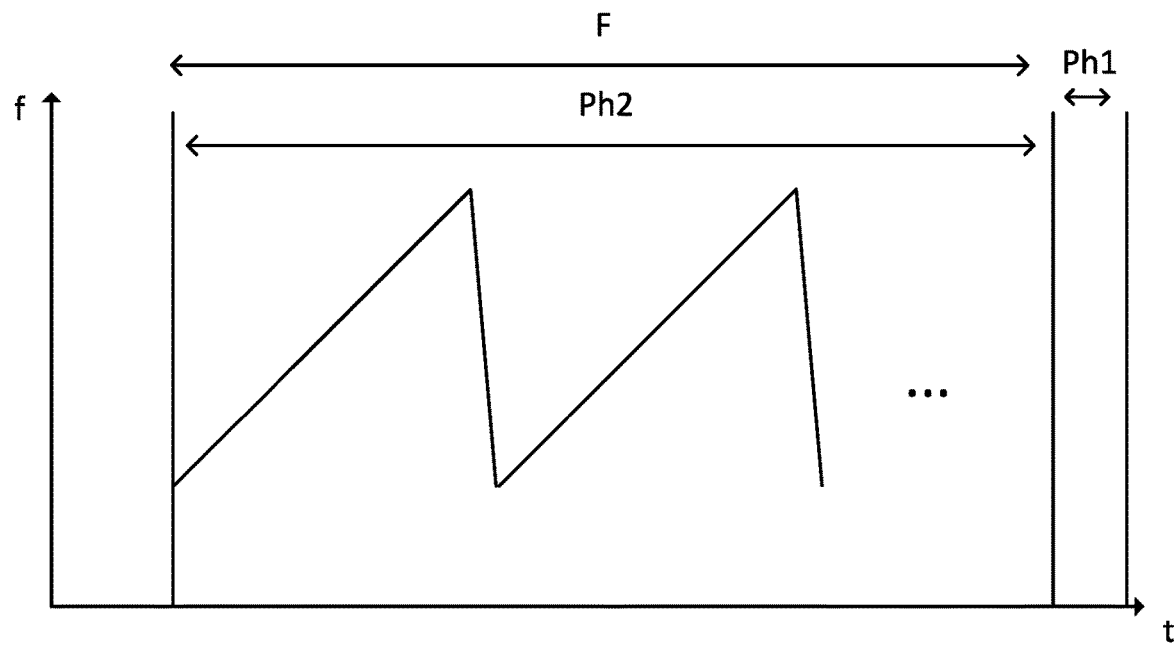

FIG. 3 shows another example of a radar signal with two chirps. Here the second phase Ph2 is chosen to correspond to a frame F of the radar signal. A frame F is a periodically repeated structure of the radar signal and may typically comprise many chirps.

The first phase Ph1 is chosen to be in between frames F of the radar signal. The first phase Ph1 may only be in between some of the frames F of the radar signal. In between other frames F of the radar signal the current mirror 14 may still be in the second phase Ph2. A second phase Ph2 may therefor span over several or many frames F and also comprise one or more times in between the frames F. The effect of putting the first phase Ph1 in between frames F of the radar signal allows for any noise on the input current of the current mirror 14 to be present in the output current of the current mirror 14 during times, when a signal generated by the other circuit 12 is not actually transmitted. For the case that the output current of the current mirror 14 is applied, e.g., as a bias current, to a device of the other circuit 12, this reduces the impact of noise present in the input current of the current mirror 14 on the signal output by the other circuit 12.

Figure 4:
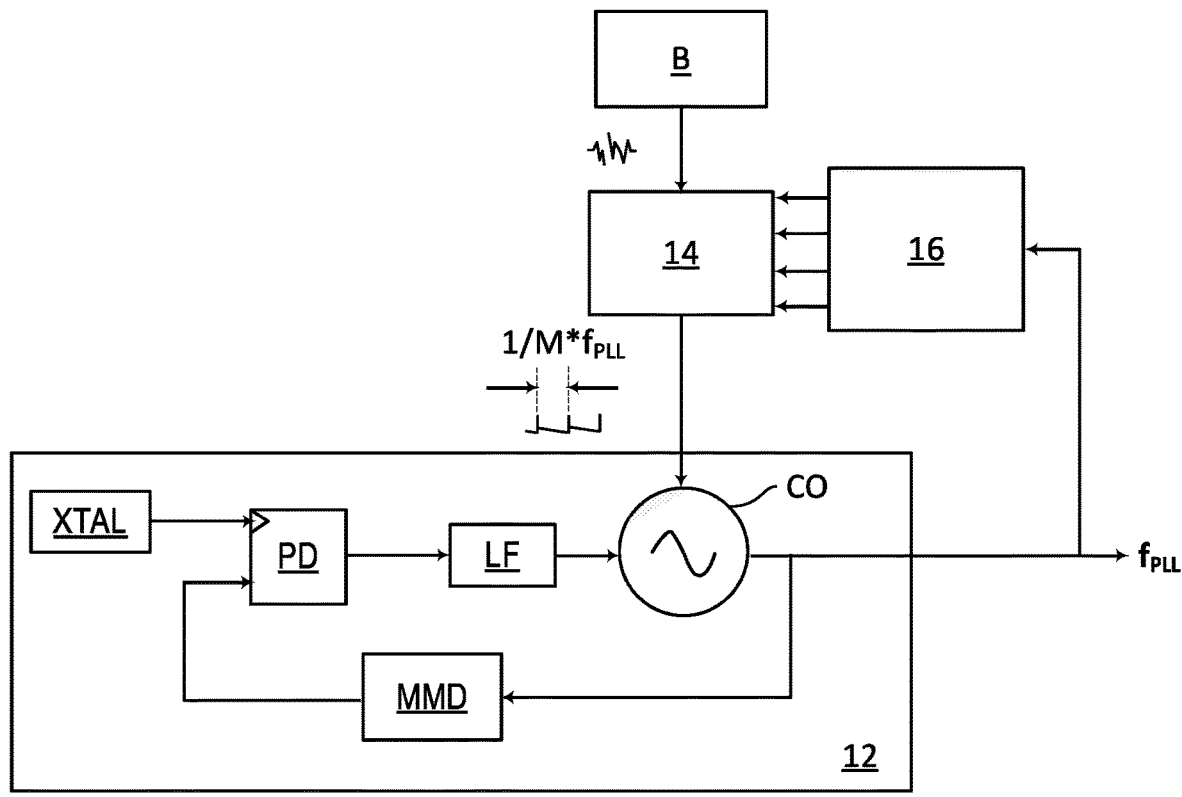
FIG. 4 illustrates a schematic block diagram of a radar device.

FIG. 4 illustrates a schematic block diagram of a phase locked loop 12 with current mirror circuit 14, input current generator B and control signal generator 16. The phase locked loop 12 may be comprised in a radar device.

A phase locked loop 12 is a circuit that generates an output signal whose phase is related to the phase of an reference signal. It may comprise a controlled oscillator CO and a phase detector PD in a feedback loop. The oscillator's frequency and phase may be controlled proportionally by an applied voltage in the case of a voltage-controlled oscillator, or they may be controlled by a digital input signal in the case of a digitally controlled oscillator. The controlled oscillator CO generates a periodic signal of a frequency $f_{PLL}$, and the phase detector PD compares the phase of that signal with the phase of the reference periodic signal, to adjust the oscillator CO to keep the phases matched. Keeping the phase of the reference signal and the phase of the output signal in lockstep also implies keeping the frequency of the reference signal and the output frequency the same. Consequently, in addition to synchronizing signals, a phase locked loop 12 can track a frequency of a reference signal, or it can generate a frequency $f_{PLL}$ that is a multiple of the input frequency.

The phase locked loop 12 may be realized on a single radar chip together with the current mirror 14 and other elements of the radar.

The input current generator B generates an input current to the current mirror circuit 14. The current mirror circuit 14 outputs an output current which is applied to the controlled oscillator CO of the phase locked loop 12, e. g. as a bias current. The controlled oscillator CO may for example be a voltage-controlled oscillator or a digitally controlled oscillator. The crystal oscillator XTAL is a precise crystal based oscillator which generates the reference signal for a phase detector PD. In some implementations, the phase locked loop circuit 12 may comprise combined phase, frequency detector PD. The loop filter LF receives the output signal of the phase detector PD. The loop filter LF outputs its signal to the controlled oscillator CO. The controlled oscillator CO may be a voltage-controlled oscillator or a digitally controlled oscillator. The output signal of the controlled oscillator CO is input to the multi-modulus divider MMD. The multi-modulus divider MMD is a frequency divider, which allows to control the frequency of the output frequency $f_{PLL}$. The frequency divided signal of the multi-modulus divider MMD is in turn input to the phase detector PD. The output signal of the phase detector PD then corresponds to the phase difference between the reference signal and the frequency divided signal output from the multi-modulus divider MMD. This allows to change the frequency of the controlled oscillator CO and to reduce frequency differences. In the case of the combined phase frequency divider, this allows to reduce the frequency difference as well.

The frequency $f_{PLL}$, which is output by the phase locked loop 12 is fed into the control signal generator 16. The control signal generator 16 generates a control signal for the switch S of the current mirror 14. The control signal for the switch S depends on the output frequency $f_{PLL}$ of the phase locked loop 12. The frequency of the control signal for the switch S is derived from the output frequency $f_{PLL}$ of the phase locked loop 12 and may for example be in the order of 1 MHz when the frequency $f_{PLL}$ is in the order of 10 GHz. The output current of the current mirror 14 is applied to a device which influences the output frequency of the phase locked loop 12. By using the output frequency $f_{PLL}$ of the phase locked loop 12 to generate the control signal for the switch S of the current mirror 14 the switch S can be controlled to be closed in a synchronized manner with the frequency $f_{PLL}$ of the phase locked loop 12, i. e. the occurrence of the first phase Ph1 can be synchronized with the frequency $f_{PLL}$. The synchronisation may for example be that the controlling frequency of the switch S, which is generated by the control signal generator 16, is synchronized and lower than the output frequency $f_{PLL}$ of the phase locked loop 12 by dividing the output frequency of the phase look by an integer number M.

As explained above, the circuit 10 and the method for operating the circuit 10 allows for the influence of the noise of an input current on the output current of the current mirror 14 to be lower during the second phase Ph2 than during a first phase Ph1. This relationship is used by synchronising the controlling signal of the switch S with the output signal of the other circuit 12, to which the output current of the current mirror 14 is applied in a way so that the first phase Ph1 with higher noise occurs when the influence on a signal produced by the other circuit 12 is lower.

In the example given in FIG. 4, the first phase Ph1 would for example occur when the amplitude of the output signal of the phase locked loop 12 is close to 0 and very small.

The described circuit 10 and method offer a technique to improve the noise of bias current generation circuits for e.g., radar applications. The connection between the two current paths of the current mirror 14 is duty-cycled with a first phase Ph1 and a second phase Ph2 with a certain frequency and sequence to keep the same functionality but reduce the noise. The examples presented that comprise a sample and hold switch may allow to replace huge low pass filters and thereby reduce the capacity of the capacitor C used.

In particular, the first phase Ph1, which may be considered a sampling time, is used to charge the capacitor C. The first phase Ph1 is controlled to occur in a time span, when the influence on the other circuit 12 is low, e. g. when the high frequency system is not operating. During the second phase Ph2, which may be considered a hold time, the energy is stored in the capacitor C. The second phase Ph2 is controlled to occur in a time span, when the influence on the other circuit 12 is high, e. g. during ramping time in FMCW radar.

The invention claimed is:

1. A circuit comprising:
   a current mirror circuit including a current path and a replica current path;
      wherein the current path comprises a first transistor,
      wherein the replica current path comprises a second transistor, and
      wherein the current path is connected to the replica current path to influence a current in the replica current path based on a reference current in the current path, the current in the replica current path being proportional to the reference current,
   a capacitor coupled between a gate of the second transistor of the replica current path and a first potential;
   a switch coupled between a gate of the first transistor of the current path and the gate of the second transistor of the replica current path;
      wherein the switch is configured to selectively disconnect the gate of the first transistor from the gate of the second transistor and from a first electrode of the capacitor, and
      wherein the switch is controllable to connect the gate of the first transistor to the gate of the second transistor and the first electrode of the capacitor during a first phase, and to disconnect the gate of the first transistor from the gate of the second transistor and from the first electrode of the capacitor during a second phase;
   a high frequency circuit configured to generate an output signal, the high frequency circuit comprising a high frequency transmitter controlled to transmit a high frequency signal during the second phase; and
   a control signal generator configured to receive the output signal as a feedback signal and generate a control signal for controlling the switch based on the output signal.

2. The circuit according to claim 1, wherein the first phase and the second phase occur periodically.

3. The circuit according to claim 1,
   wherein the high frequency circuit comprises a radar device and is configured to generate and/or transmit a radar signal,
   wherein the high frequency circuit is configured to generate the radar signal,
   wherein the radar device comprises frequency modulated continuous wave (FMCW) radar device, and
   wherein the first phase is a flyback time between frequency ramps within a frame of the high frequency signal.

4. The circuit according to claim 1, wherein the first phase is between frames of the high frequency signal.

5. The circuit according to claim 1, wherein the first potential is at one of a supply potential or a ground potential.

6. The circuit according to claim 1, wherein the circuit further comprises at least one of:
   a voltage-controlled oscillator, or
   a power amplifier.

7. The circuit according to claim 1, wherein the switch is controlled based on the high frequency signal.

8. The circuit according to claim 7, wherein a frequency of the control signal depends on a frequency of the high frequency signal.

9. The circuit according to claim 8, wherein the frequency of the control signal is synchronized to the high frequency signal.

10. The circuit according to claim 1, wherein the switch is configured to charge the capacitor during the first phase, and
wherein the circuit is configured such that the gate of the second transistor is connected to the first electrode of the capacitor during the second phase such that the gate of the second transistor is controlled by a potential of the first electrode.

11. A method for operating a circuit, the circuit comprising a current mirror circuit with a current path comprising a first transistor and a replica current path comprising a second transistor, wherein the current path is connected to the replica current path, and wherein a capacitor is coupled between a gate of the second transistor and a first potential, the method comprising:
influencing a current in the replica current path based on a reference current in the current path, the current in the replica current path being proportional to the reference current;
connecting a gate of the first transistor to the gate of the second transistor and to a first electrode of the capacitor during a first phase;
selectively disconnecting the gate of the first transistor from the gate of the second transistor and from the first electrode of the capacitor during a second phase;
generating an output signal, wherein the output signal is a frequency-modulated continuous-wave (FMCW) signal comprising a plurality of frames and a plurality of frequency ramps within each frame of the plurality of frames; and
transmitting the output signal as a high frequency signal during the second phase based on disconnecting the gate of the first transistor from the gate of the second transistor and from the first electrode of the capacitor,
wherein the high frequency signal corresponds to a frequency ramp, and
wherein the first phase corresponds to a flyback time of the output signal, the flyback time being a period between two consecutive frequency ramps of the plurality of frequency ramps of a respective frame.

12. The method according to claim 11, further comprising:
outputting the current in the replica current path to a high frequency circuit; and
influencing, based on outputting the current in the replica current path to the high frequency circuit, one or more of:
a generation of the output signal, or
transmission of the high frequency signal.

13. The method according to claim 11, further comprising:
charging the capacitor during the first phase, and
wherein the gate of the second transistor is connected to the first electrode of the capacitor during the second phase such that the gate of the second transistor is controlled by a potential of the first electrode.

14. The method according to claim 11, wherein the first phase and the second phase occur periodically within a respective frame.

15. The circuit according to claim 1, wherein the control signal depends on a frequency of the output signal.

16. The circuit according to claim 1, wherein the control signal generator is configured to control the switch such that the switch is closed in a synchronized manner with a frequency of the output signal.

17. A circuit comprising:
a current mirror circuit including a current path and a replica current path;
wherein the current path comprises a first transistor,
wherein the replica current path comprises a second transistor, and
wherein the current path is connected to the replica current path to influence a current in the replica current path based on a reference current in the current path, the current in the replica current path being proportional to the reference current,
a capacitor coupled between a gate of the second transistor of the replica current path and a first potential;
a switch coupled between a gate of the first transistor of the current path and the gate of the second transistor of the replica current path;
wherein the switch is configured to selectively disconnect the gate of the first transistor from the gate of the second transistor and from a first electrode of the capacitor, and
wherein the switch is controllable to connect the gate of the first transistor to the gate of the second transistor and the first electrode of the capacitor during a first phase, and to disconnect the gate of the first transistor from the gate of the second transistor and from the first electrode of the capacitor during a second phase; and
a high frequency circuit configured to generate an output signal, the high frequency circuit comprising a high frequency transmitter controlled to transmit a high frequency signal during the second phase,
wherein the output signal is a frequency-modulated continuous-wave (FMCW) signal comprising a plurality of frames and a plurality of frequency ramps within each frame of the plurality of frames,
wherein the first phase corresponds to a non-transmission time between two consecutive frequency ramps of the plurality of frequency ramps of a respective frame, during which no frequency ramp is transmitted, and
wherein the second phase corresponds a transmission time of each frequency ramp of the plurality of frequency ramps.

18. The circuit according to claim 17, wherein the first phase and the second phase occur periodically within each frame of the plurality of frames such that the switch is opened and closed within the respective frame in accordance with the first phase and the second phase.

* * * * *